(12) United States Patent
Ellis

(10) Patent No.: US 9,706,185 B2
(45) Date of Patent: Jul. 11, 2017

(54) DEVICE CONTROL EMPLOYING THREE-DIMENSIONAL IMAGING

(71) Applicant: Canrig Drilling Technology Ltd., Houston, TX (US)

(72) Inventor: Brian Ellis, Houston, TX (US)

(73) Assignee: Canrig Drilling Technology Ltd., Houston, TX (US)

( * ) Notice: Subject to any disclaimer, the term of this patent is extended or adjusted under 35 U.S.C. 154(b) by 834 days.

(21) Appl. No.: 13/863,112

(22) Filed: Apr. 15, 2013

(65) Prior Publication Data

US 2013/0271576 A1  Oct. 17, 2013

Related U.S. Application Data

(60) Provisional application No. 61/624,776, filed on Apr. 16, 2012.

(51) Int. Cl.
| | | |
|---|---|---|
| *H04N 13/02* | (2006.01) | |
| *E21B 19/00* | (2006.01) | |
| *G06F 17/50* | (2006.01) | |
| *E21B 41/00* | (2006.01) | |
| *B25J 19/02* | (2006.01) | |

(Continued)

(52) U.S. Cl.
CPC ........ *H04N 13/0203* (2013.01); *B25J 19/023* (2013.01); *E21B 19/00* (2013.01); *E21B 19/20* (2013.01); *E21B 41/00* (2013.01); *F16P 3/142* (2013.01); *G06F 17/5009* (2013.01)

(58) Field of Classification Search
CPC ........... H04N 13/0239; H04N 13/0055; H04N 13/0296; H04N 13/0497; H04N 13/0242; G01N 25/72; G01M 3/002; G01M 3/38; G01J 5/0022; B23K 31/12; E21B 33/068; E21B 33/04; E21B 19/22; E21B 33/03; E21B 19/00
See application file for complete search history.

(56) References Cited

U.S. PATENT DOCUMENTS

| | | |
|---|---|---|
| 4,610,005 A | 9/1986 | Utasi |
| 4,976,143 A | 12/1990 | Casso |

(Continued)

FOREIGN PATENT DOCUMENTS

| | | |
|---|---|---|
| WO | WO 2007/081628 A2 | 7/2007 |
| WO | WO 2007/081628 A3 | 7/2007 |

OTHER PUBLICATIONS

International Search Report and Written Opinion issued for PCT/US2013/036793 dated May 27, 2014, 10 pgs.

(Continued)

*Primary Examiner* — Sath V Perungavoor
*Assistant Examiner* — Howard D Brown, Jr.
(74) *Attorney, Agent, or Firm* — Haynes and Boone, LLP

(57) ABSTRACT

At least a portion of a wellsite is disposed in a control volume of three-dimensional space. At least one camera is configured to provide three-dimensional imaging of the control volume. At least one device is disposed in, or is expected to be moved into, the control volume so that the at least one device is included in the three-dimensional imaging when the at least one device is disposed in the control volume and the at least one camera provides the three-dimensional imaging. In an exemplary embodiment, the at least one camera is connected to a drilling rig.

23 Claims, 4 Drawing Sheets

(51) Int. Cl.
*F16P 3/14* (2006.01)
*E21B 19/20* (2006.01)

(56) References Cited

U.S. PATENT DOCUMENTS

| | | | |
|---|---|---|---|
| 5,107,705 A * | 4/1992 | Wraight | E21B 19/20 |
| | | | 348/85 |
| 5,461,905 A | 10/1995 | Penisson | |
| 6,194,860 B1 | 2/2001 | Seelinger et al. | |
| 6,608,913 B1 | 8/2003 | Hinton et al. | |
| 7,163,335 B2 * | 1/2007 | Dishaw | E21B 19/165 |
| | | | 374/121 |
| 7,313,506 B2 | 12/2007 | Kacyra et al. | |
| 7,327,383 B2 | 2/2008 | Valleriano et al. | |
| 7,357,196 B2 * | 4/2008 | Goldman | E21B 12/02 |
| | | | 175/24 |
| 8,417,495 B2 * | 4/2013 | Dashevskiy | E21B 44/00 |
| | | | 175/45 |
| 2002/0120401 A1 * | 8/2002 | Macdonald | E21B 44/005 |
| | | | 702/6 |
| 2008/0179094 A1 * | 7/2008 | Repin | E21B 44/00 |
| | | | 175/50 |
| 2009/0152005 A1 * | 6/2009 | Chapman | E21B 7/00 |
| | | | 175/24 |
| 2009/0187391 A1 * | 7/2009 | Wendt | G01V 1/28 |
| | | | 703/7 |
| 2010/0147510 A1 * | 6/2010 | Kwok | G01V 11/00 |
| | | | 166/250.01 |
| 2010/0155142 A1 * | 6/2010 | Thambynayagam | E21B 44/00 |
| | | | 175/61 |
| 2010/0250139 A1 * | 9/2010 | Hobbs | E21B 47/12 |
| | | | 702/6 |
| 2011/0297395 A1 | 12/2011 | Codesal et al. | |
| 2012/0274664 A1 * | 11/2012 | Fagnou | G06F 3/04855 |
| | | | 345/660 |
| 2013/0265409 A1 * | 10/2013 | Tjhang | H04N 5/23229 |
| | | | 348/82 |
| 2013/0311147 A1 * | 11/2013 | Greenwood | G06Q 10/06 |
| | | | 703/1 |

OTHER PUBLICATIONS

"Trimble," http://www.trimble.com/3Dlaser-scanning/fx.aspx?dtID-overview&, 1page.
"Optech," http://www.optech.ca/i3dropline-ilris3d.htm, 2 pages.
U.S. Appl. No. 13/863,929, filed Apr. 16, 2013, Ellis et al.

* cited by examiner

DEVICE CONTROL EMPLOYING THREE-DIMENSIONAL IMAGING

CROSS-REFERENCE TO RELATED APPLICATION

This application claims the benefit of the filing date of and priority to U.S. Provisional Application No. 61/624,776 filed Apr. 16, 2012, entitled "Device Control Employing Three-Dimensional Imaging," to Brian Ellis, the entire disclosure of which is hereby incorporated herein by reference.

BACKGROUND OF THE DISCLOSURE

Historically on drilling or service rigs, rig crews have positioned slips to set pipe in hole at a certain height, brought in tongs at the right height to latch onto tool joints (or set the height of an iron roughneck), or adjusted the height of mud buckets, pipe dopers, etc. All of this is done because the human eye is needed to identify where the height of the pipe needs to be (slip set) or where it is relative to floor and other equipment that must interact with it. The same can be said for the traditional derrickman or, even with the advent of more automated pipe handling, there is still the need for human intervention to guide and position equipment as there has been no reliable way of knowing where pipe or tubular might be exactly. Likewise it is always difficult to know exactly where all of the equipment is relative to each other so that different pieces of equipment do not run into each other. Existing systems depend on systems knowing and reporting their current location and another system coordinating to make sure that they don't run into each other. This is less than perfect but it is the best that can be done with a calibrated automation control system requiring minimum human intervention. Much has been done with two-dimensional (2D) vision systems, but without depth it has been almost impossible to apply in the wellsite environment because of lighting changes, air/environment changes and variable pieces of equipment that come in and out of view and make a system very complex.

SUMMARY

In a first aspect, the present disclosure encompasses an apparatus including: at least one camera configured to provide three-dimensional imaging of a control volume of three-dimensional space; at least a portion of a wellsite disposed in the control volume; and at least one device disposed in, or expected to be moved into, the control volume so that the at least one device is included in the three-dimensional imaging when the at least one device is disposed in the control volume and the at least one camera provides the three-dimensional imaging.

In a second aspect, the present disclosure encompasses a method, including: receiving three-dimensional imaging data associated with a control volume of three-dimensional space, wherein at least a portion of a wellsite is disposed in the control volume; comparing the three-dimensional data with another set of data associated with a device disposed in, or expected to be moved into, the control volume; and controlling the device based on at least the comparison between the three-dimensional data and the another set of data.

In a third aspect, the present disclosure encompasses a method, including: receiving three-dimensional imaging data associated with a control volume of three-dimensional space, wherein at least a portion of a wellsite is disposed in the control volume; calculating one or more dimensions using the three-dimensional imaging data; and at least one of the following: calibrating a first system located at the wellsite using the calculated one or more dimensions; identifying a first component located at the wellsite based on the calculated one or more dimensions; counting a plurality of second components located at the wellsite based on the calculated one or more dimensions; and controlling a second system located at the wellsite using the calculated one or more dimensions.

In a fourth aspect, the present disclosure encompasses an apparatus, including: a computer readable medium; and a plurality of instructions stored on the computer readable medium and executable by one or more processors, the plurality of instructions including: instructions that cause the one or more processors to receive three-dimensional imaging data associated with a control volume of three-dimensional space, wherein at least a portion of a wellsite is disposed in the control volume; instructions that cause the one or more processors to compare the three-dimensional data with another set of data associated with a device disposed in, or expected to be moved into, the control volume; and instructions that cause the one or more processors to control the device based on at least the comparison between the three-dimensional data and the another set of data.

In a fifth aspect, the present disclosure encompasses an apparatus, including: a computer readable medium; and a plurality of instructions stored on the computer readable medium and executable by one or more processors, the plurality of instructions including: instructions that cause the one or more processors to receive three-dimensional imaging data associated with a control volume of three-dimensional space, wherein at least a portion of a wellsite is disposed in the control volume; instructions that cause the one or more processors to calculate one or more dimensions using the three-dimensional imaging data; and at least one of the following: instructions that cause the one or more processors to calibrate a first system located at the wellsite using the calculated one or more dimensions; instructions that cause the one or more processors to identify a first component located at the wellsite based on the calculated one or more dimensions; instructions that cause the one or more processors to count a plurality of second components located at the wellsite based on the calculated one or more dimensions; and instructions that cause the one or more processors to control a second system located at the wellsite using the calculated one or more dimensions.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
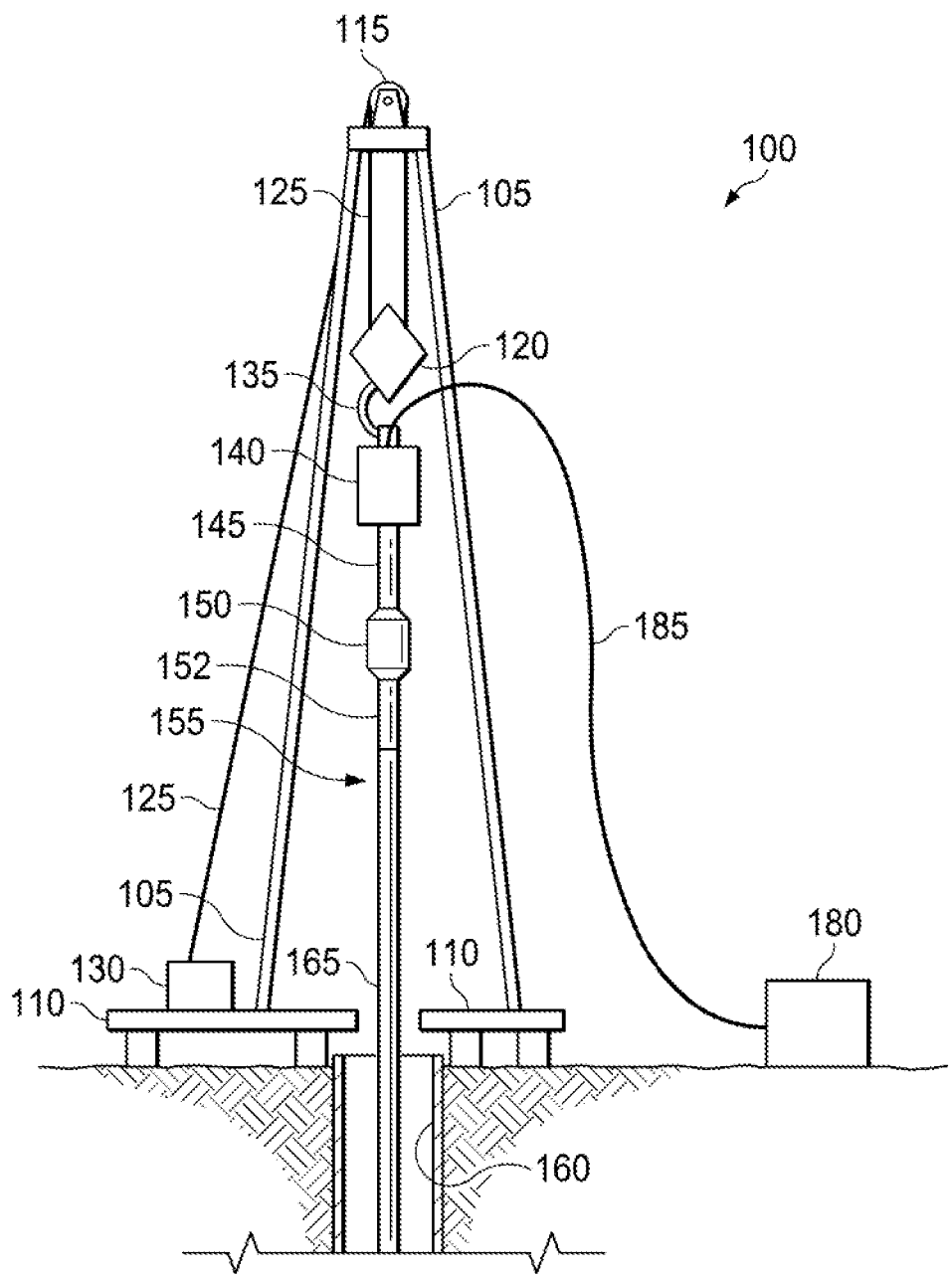
FIG. 1 is a schematic view of conventional apparatus.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a schematic view of apparatus 100. The apparatus 100 demonstrates an exemplary environment in which an apparatus within the scope of the present disclosure may be implemented. The apparatus 100 is or includes a land-based drilling rig. However, one or more aspects of the present disclosure are applicable or readily adaptable to any type of wellsite equipment, such as a drilling rig. The drilling rig may include without limitation one or more jack-up rigs, semisubmersibles, drill ships, coil tubing rigs, and casing drilling rigs, among others. Apparatus 100 includes a mast 105 supporting lifting gear above a rig floor 110. The lifting gear includes a crown block 115 and a traveling block 120. The crown block 115 is coupled at or near the top of the mast 105, and the traveling block 120 hangs from the crown block 115 by a drilling line 125. The drilling line 125 extends from the lifting gear to draw-works 130, which is configured to reel the drilling line 125 out and in to cause the traveling block 120 to be lowered and raised relative to the rig floor 110. A hook 135 may be attached to the bottom of the traveling block 120. A top drive 140 may be suspended from the hook 135. A quill 145 extending from the top drive 140 may be attached to a saver sub 150, which may be attached to a tubular lifting device 152. The tubular lifting device 152 can be engaged with a drill string 155 suspended within and/or above a wellbore 160. The drill string 155 may include one or more interconnected sections of drill pipe 165, among other components. It should be understood that the use of the term "pipe" herein is merely an exemplary type of tubular and that various other types of tubulars (e.g., casing) can often be substituted depending on the desired operation. One or more pumps 180 may deliver drilling fluid to the drill string 155 through a hose or other conduit 185, which may be connected to the top drive 140. The drilling fluid may pass through a central passage of the tubular lifting device 152. In an alternative embodiment, the top drive 140, quill 145 and sub 150 may not be utilized between the hook 125 and the tubular lifting device 152, such as where the tubular lifting device 152 is coupled directly to the hook 125, or where the tubular lifting device 152 is coupled to the hook 125 via other components.

Figure 2:
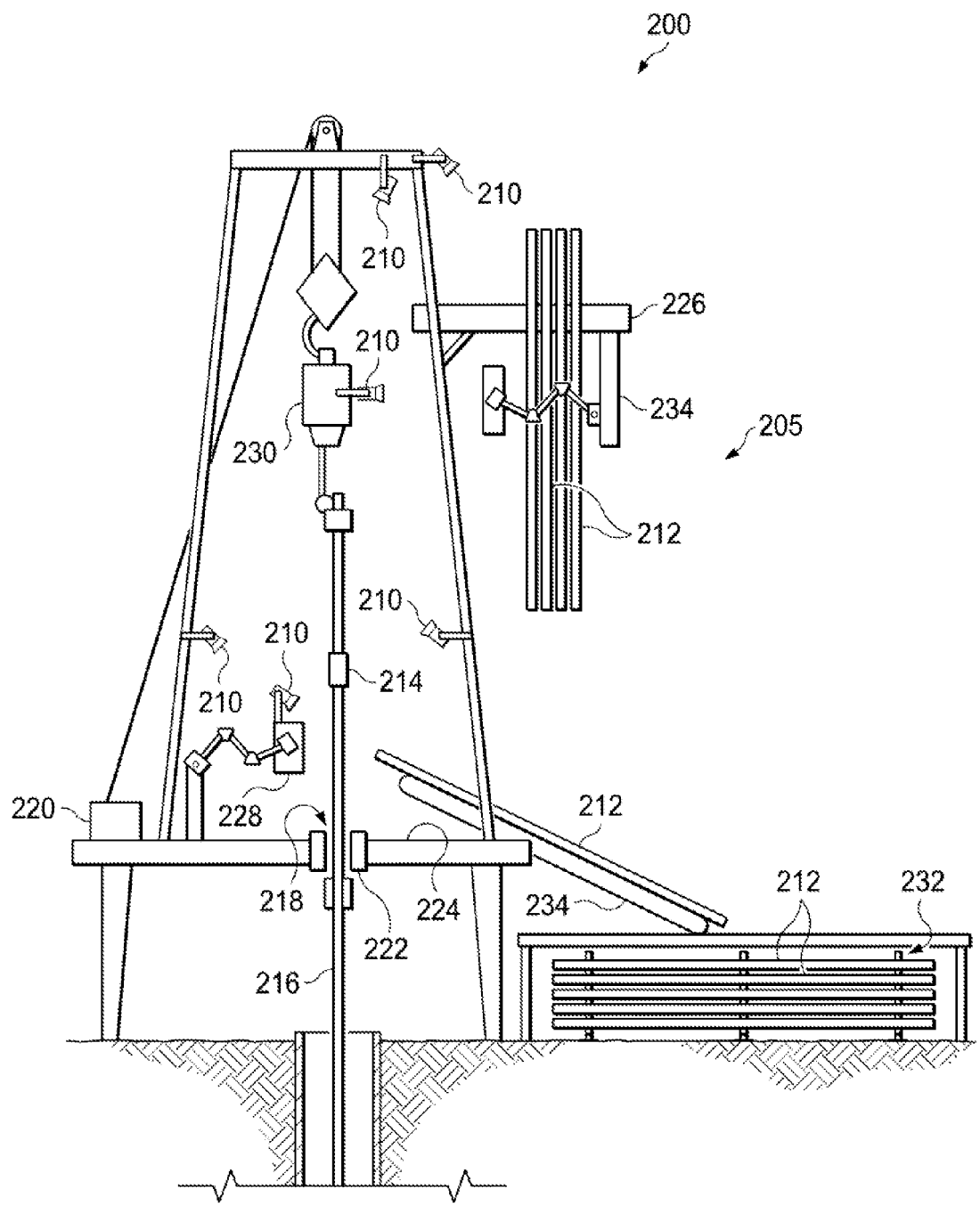
FIG. 2 is a schematic view of apparatus according to one or more aspects of the present disclosure.

Referring to FIG. 2, illustrated is a schematic view of apparatus 200, which is within the scope of the present disclosure and includes a drilling or service rig 205, and a plurality of cameras 210. Each of the cameras 210 is a three-dimensional (3D) camera, providing 3D still or video imaging in real time or near real time. In an exemplary embodiment, each of the cameras 210 provides, in real time or near real time, both two dimensional (2D) intensity images and depth information, and converts each 2D point into 3D space by conducting one or more calculations relative to the location of the camera 210. In an exemplary embodiment, each of the cameras 210 provides a 3D focal plane array. In an exemplary embodiment, each of the cameras 210 provides 3D still or moving (or video or movie) imaging in various environments, such as environments including dust, smoke and/or fog. In an exemplary embodiment, each of the cameras 210 provides 3D imaging at frame rates ranging from about 20 Hz to about 200 Hz. In an exemplary embodiment, each of the cameras 210 or associated equipment emits a short laser pulse to determine depth information. In an exemplary embodiment, each of the cameras 210 provides thermal imaging, visual imaging, infrared imaging, or a combination thereof. In an exemplary embodiment, each of the cameras 210 creates a 3D survey of the subject control volume. In an exemplary embodiment, each of the cameras 210 provides 3D mapping over a range of degrees such as, for example, a range of 120 degrees. In several exemplary embodiments, one or more of the cameras 210 are 3D Flash Light Detection and Ranging (LIDAR) cameras, which are available from Advanced Scientific Concepts, Inc., Santa Barbara, Calif. In several exemplary embodiments, one or more of the foregoing embodiments of the cameras 210 are combined in whole or in part with one or more other of the foregoing embodiments of the camera 210.

With continuing reference to FIG. 2, automation of the apparatus 200 is improved significantly using the cameras 210 to view the location of equipment, critical areas of equipment, and relative locations of tubulars 212 and other moveable items in a control volume of three-dimensional space of interest (or a three-dimensional area of interest). For example, to set the top of a tool joint 214 at 3 feet off floor 224, one of the cameras 210 senses the location of pipe 216 in hole 218, and the software operating the camera 210 identifies the tool joint 214 and the top edge and hence communicates to draw-works 220 and slips 222 how to act to set the pipe 216 at 3 feet off the floor 224.

The sensing of depth by the cameras 210 allows the apparatus 200 to automatically operate regardless of lighting changes, air/environment changes and variable pieces of equipment that come in and out of view of the cameras 210. With the cameras 210 and their 3D capability, and thus information regarding the use of physical dimensions of equipment and other pieces, control systems monitor this information to automate one or more operational functions of the apparatus 200, including automating the tubular handling and running activities on the drilling or service rig 205.

Within the apparatus 200, control volumes of different three-dimensional spaces are set up and identified where equipment can or should be present, and equipment is controlled (e.g., moved) to interact with the equipment being sensed by the cameras 210 assigned to respective ones of the control volumes.

Employing one or more of the cameras 210 to obtain three-dimensional viewing of one or more control volumes of three-dimensional spaces, examples of activities that can be automated include: unlatching drillpipe or a tubular 212 at racking board 226, including handling such as grab and pull back; tailing and positioning a tubular 212 on the rig floor 224; setting a tubular 212 at a set height in a hole;

bringing an iron roughneck 228 to well center or mouse hole and automatically setting height to make or break connections between tubulars 212; positioning a mud bucket at a tool joint and automatically adjusting height to tool joint; creating tubular handling sequences of events/processes that work by themselves reliably and with minimal or no human intervention until needed; sensing tubular makeup or breakout; and stopping operations safely because a human or an unknown object strays into a control volume that renders the control volume or planned (or ongoing) operation unsafe.

In an exemplary embodiment, the apparatus 200 includes programmable logic controller(s), as well as the cameras 210 with their three-dimensional sensor and software technology, and thus provides the ability to confidently automate one or more sequences (or a portion thereof) where humans have typically been needed to confirm that it is safe to proceed, such as, for example, to ensure a top drive 230 avoids running into pipe because the racking device did not have the pipe out of the way.

In an exemplary embodiment, several of the cameras 210 are needed to cover a particular control volume and paint a clear three dimensional picture of the scene for the equipment controllers to interact with. The ability of equipment to see and be seen in the digital control world such that everything can come closer but never touch, or actually contact in a desired manner rather than an uncontrolled manner, is invaluable to providing autonomous automatic operations, particularly in a wellsite environment.

In several exemplary embodiments, other operational uses on the drilling or service rig 205 include counting and sizing pipes or tubulars 212 on a pipe rack 232. The three-dimensional sensing of the cameras 210 allows the apparatus 200 or portions thereof to find or pick an area in three-dimensional space (i.e., the pipe rack area), and look for items with criteria within the three-dimensional space (e.g., pipe joints that are roughly 30 feet long and six inches wide and rounded).

In several exemplary embodiments, the apparatus 200 or portions thereof monitor the levels of fluids in one or more active mud tanks and calculate a total volume per tank and/or for all mud tanks, and do this on a second-by-second basis or other desired frequency. This allows for increasingly accurate measurement of mud in versus mud out of hole.

In several exemplary embodiments, the apparatus 200 or portions thereof conduct automatic calibration of the hoisting system of a drilling rig, with the cameras 210 telling the control system where the hoisting system is located constantly or at a sufficient frequency (e.g., once every second or tenth of a second) and the hoisting system, which includes a control system, confirming the information supplied by the cameras 210. If there is an inconsistency, the operation of the hoisting system may be stopped. In several exemplary embodiments, the apparatus 200 or portions thereof conduct automatic calibration of other equipment such as, for example, a top drive system (TDS) including the top drive 230, a casing running tool (CRT), a pipe racker 234, the iron roughneck 228, etc., and any combination thereof.

In several exemplary embodiments, the resolution of the 3D pictures provided by one or more of the cameras 210, as well as the frequency of updates, are sufficient to implement automatic operation of equipment, such as the apparatus 100, systems, methods, processes, and/or any combination thereof.

In an exemplary embodiment, the apparatus 200 or at least a portion thereof includes the apparatus 100, and the above-described operation of the apparatus 100 is fully automatic, with the cameras 210 providing real time or near real time 3D imaging of the various components of the apparatus 100.

Figure 3:
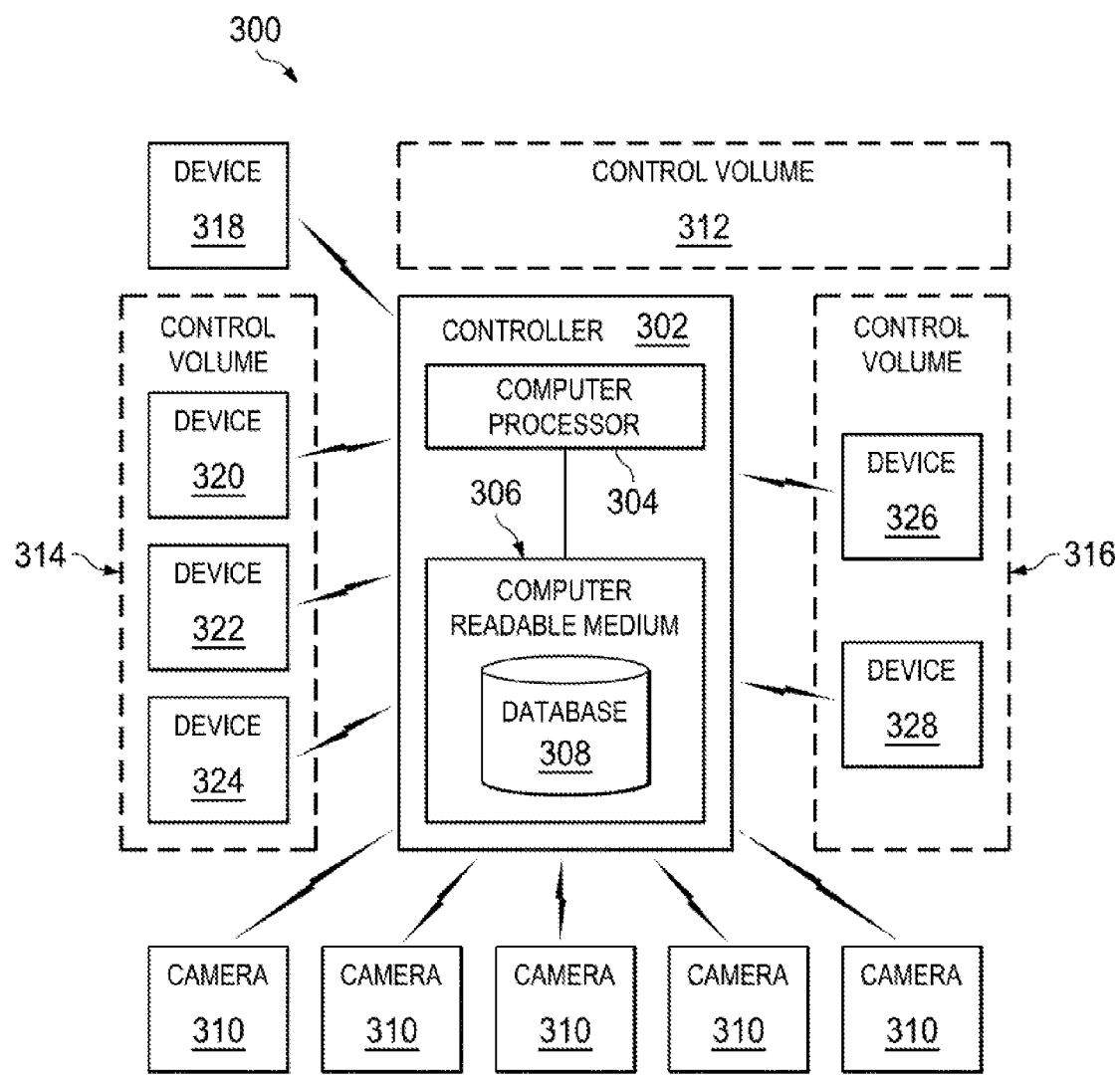
FIG. 3 is a schematic view of apparatus according to one or more aspects of the present disclosure.

Referring to FIG. 3, an apparatus is generally referred to by the reference numeral 300 and includes a controller 302, which includes a computer processor 304 and a computer readable medium 306 operably coupled thereto. Instructions accessible to, and executable by, the computer processor 304 are stored on the computer readable medium 306. The computer readable medium 306 includes a database 308. A plurality of cameras 310 are operably coupled to, and in communication with, the controller 302. The cameras 310 are substantially identical to the cameras 210 and therefore will not be described in further detail. Respective combinations of the cameras 310 are positioned in respective ones of a plurality of control volumes of three-dimensional spaces 312, 314, 316. A device 318 is expected to be moved into the control volume 312. Devices 320, 322 and 324 are positioned in the control volume 314. Devices 326 and 328 are positioned in the control volume 316. The controller 302 is operably coupled to, and in communication with, each of the devices 318, 320, 322, 324, 326 and 328.

In an exemplary embodiment, during operation, the cameras 310 provide real time or near real time 3D imaging of three-dimensional spaces contained in the control volumes 312, 314 and 316, and thus provide real time or near real time 3D imaging of the interaction between the control volumes 312, 314 and 316 and the devices 318, 320, 322, 324, 326 and 328. The 3D imaging information is transmitted from the cameras 310 to the controller 302. Based on at least the 3D imaging transmitted from the cameras 310, the controller 302 controls one or more of the devices 318, 320, 322, 324, 326 and 328 or portions thereof by, for example, identifying, counting, controlling the operation of, controlling the position and/or movement of, and/or determining the sizes of, the one or more devices 318, 320, 322, 324, 326 and 328 or portions thereof. In several exemplary embodiments, one or more of the control volumes 312, 314 and 316 are at a wellsite, and one or more of the devices 318, 320, 322, 324, 326 and 328 are employed in mineral exploration and production activities, such as oil and gas exploration and production activities.

In several exemplary embodiments, the operation of the apparatus 300 is substantially identical to the operation of the apparatus 200.

In an exemplary embodiment, one or more of the cameras 210 or 310 are permanently fixed within the apparatus 200 or 300, respectively. In an exemplary embodiment, one or more of the cameras 210 or 310 are movable within the apparatus 200 or 300, respectively.

In an exemplary embodiment, the apparatus 200 or 300 operates to determine a length dimension of a tubular. In an exemplary embodiment, two cameras 210 or 310 are employed to provide 3D imaging of a device such as, for example, the device 318, 320, 322, 324, 326 or 328.

In an exemplary embodiment, the output of the cameras 210 or 310 controls one or more tools such as, for example, an iron roughneck, a pipe handler, a casing running tool, a top drive system, a hoisting system, a mud tank farm, and/or any combination thereof.

In an exemplary embodiment, the apparatus 200 or 300 is employed to identify, count, control the operation of, control the position and/or movement of, and/or determine the size of, equipment at a wellsite.

In an exemplary embodiment, the apparatus 200 or 300 is employed to identify, count, control the operation of, control the position and/or movement of, and/or determine the size of, equipment at a rigsite.

In an exemplary embodiment, the apparatus 200 or 300 is employed to manage drums or bags, or both, employed in connection with drilling mud or fluid.

In an exemplary embodiment, the cameras 210 or 310 are layered linearly, radially, circumferentially and/or any combination thereof, in order to sufficiently provide 3D imaging of equipment at a wellsite. In an exemplary embodiment, three cameras 210 or 310 are provided, with each camera 210 or 310 providing 3D imaging across a 120-degree sweep, in order to sufficiently provide 360-degree 3D imaging of a piece of equipment, such as a tubular.

In an exemplary embodiment, the apparatus 200 or 300, or the cameras 210 or 310, are employed at an underwater wellsite in order to, for example, inspect subsea connections, subsea blowout prevention (BOP) stacks, offshore drilling activities, or offshore drilling production activities.

In an exemplary embodiment, the apparatus 200 or 300, or the cameras 210 or 310, are employed in determining the structural integrity of one or more components or equipment at a wellsite. For example, the apparatus 200 or 300, or the cameras 210 or 310, are employed to determine the structural integrity of risers.

In an exemplary embodiment, the apparatus 200 or 300, or the cameras 210 or 310, are employed in counting the number of tubulars that are on a rack.

In an exemplary embodiment, the apparatus 200 or 300, or the cameras 210 or 310, are employed in finding a target on a piece of equipment, such as a tubular, thereby identifying the piece of equipment, the position of the equipment, or both. In an exemplary embodiment, the apparatus 200 or 300 operates as a camera-driven encoder system.

In an exemplary embodiment, the apparatus 200 or 300, or the cameras 210 or 310, are time synced to logs coming out of a well at a wellsite.

In an exemplary embodiment, the apparatus 200 or 300, or the cameras 210 or 310, operate as a digital video recording, recording activities at a wellsite for future reference; thus, the apparatus 200 or 300, or the cameras 210 or 310, serve as a "black box" for the wellsite, providing a historical record of activities at the wellsite. In an exemplary embodiment, historical records are stored in the database 308.

In an exemplary embodiment, one or more of the cameras 210 or 310 are mounted on, or are part of, a downhole tool that is lowered by a wireline into a wellbore. While moving, or being positioned within, the wellbore, the cameras 210 or 310 survey or inspect the wellbore, and/or any casing within the wellbore. In an exemplary embodiment, the cameras 210 or 310 are employed to inspect such casing after hydraulic fracturing activities.

In an exemplary embodiment, one or more of the cameras 210 or 310 are mounted on, or are part of, a downhole tool that is lowered by a wireline into a wellbore. While moving, or being positioned within, the wellbore, the cameras 210 or 310 look for casing problems, tubular breakoffs, or unwanted material ("junk") in the wellbore.

Figure 4:
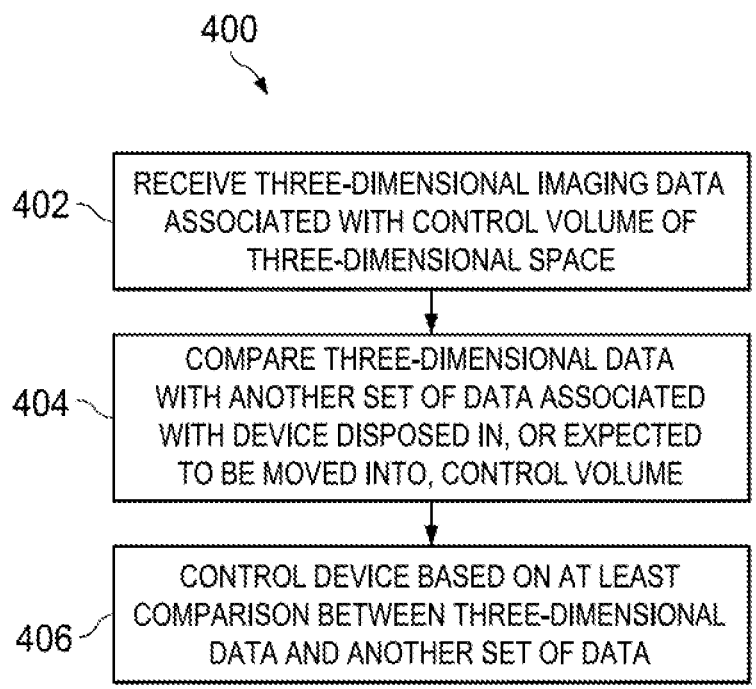
FIG. 4 is a flow-chart diagram of at least a portion of a method according to one or more aspects of the present disclosure.

Referring to FIG. 4, at least a portion of a method according to one or more aspects of the present disclosure is generally referred to by the reference numeral 400 and includes at step 402 receiving three-dimensional imaging data associated with a control volume of three-dimensional space; at step 404 comparing the three-dimensional data with another set of data associated with a device disposed in, or expected to be moved into, the control volume; and at step 406 controlling the device based on at least the comparison between the three-dimensional data and the another set of data.

Figure 5:
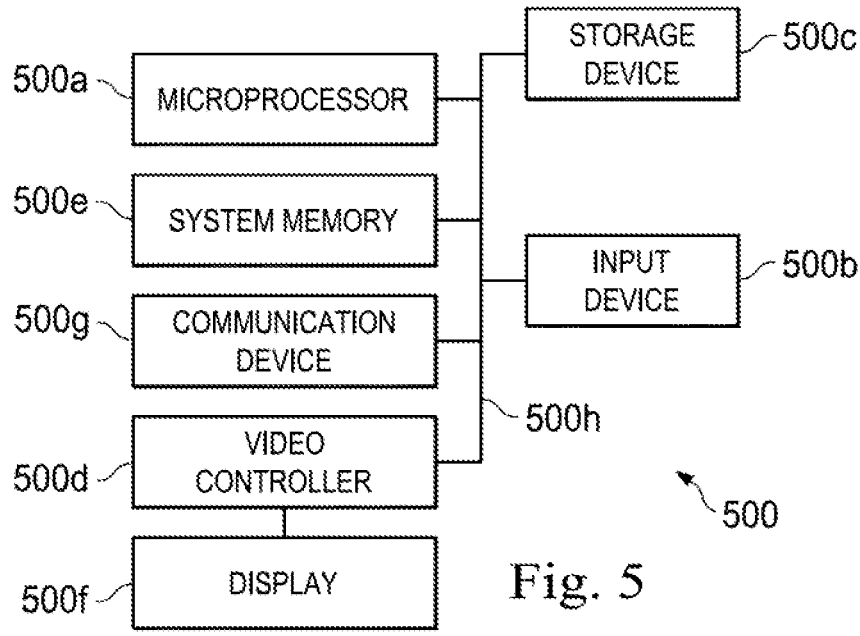
FIG. 5 is a schematic view of a node for implementing one or more aspects of the present disclosure.

Referring to FIG. 5, an exemplary node 500 for implementing one or more embodiments of one or more of the above-described apparatus, elements, methods and/or steps, and/or any combination thereof, is depicted. The node 500 includes a microprocessor 500a, an input device 500b, a storage device 500c, a video controller 500d, a system memory 500e, a display 500f, and a communication device 500g, all of which are interconnected by one or more buses 500h. In several exemplary embodiments, the storage device 500c may include a floppy drive, hard drive, CD-ROM, optical drive, any other form of storage device and/or any combination thereof. In several exemplary embodiments, the storage device 500c may include, and/or be capable of receiving, a floppy disk, CD-ROM, DVD-ROM, or any other form of computer-readable medium that may contain executable instructions. In several exemplary embodiments, the communication device 500g may include a modem, network card, or any other device to enable the node to communicate with other nodes. In several exemplary embodiments, any node represents a plurality of interconnected (whether by intranet or Internet) computer systems, including without limitation, personal computers, mainframes, PDAs, smartphones and cell phones.

In several exemplary embodiments, one or more of the components of the apparatus 200 or 300 include at least the node 500 and/or components thereof, and/or one or more nodes that are substantially similar to the node 500 and/or components thereof. In several exemplary embodiments, one or more of the above-described components of the node 500 and/or the apparatus 200 or 300 include respective pluralities of same components.

In several exemplary embodiments, a computer system typically includes at least hardware capable of executing machine readable instructions, as well as the software for executing acts (typically machine-readable instructions) that produce a desired result. In several exemplary embodiments, a computer system may include hybrids of hardware and software, as well as computer sub-systems.

In several exemplary embodiments, hardware generally includes at least processor-capable platforms, such as client-machines (also known as personal computers or servers), and hand-held processing devices (such as smart phones, tablet computers, personal digital assistants (PDAs), or personal computing devices (PCDs), for example). In several exemplary embodiments, hardware may include any physical device that is capable of storing machine-readable instructions, such as memory or other data storage devices. In several exemplary embodiments, other forms of hardware include hardware sub-systems, including transfer devices such as modems, modem cards, ports, and port cards, for example.

In several exemplary embodiments, software includes any machine code stored in any memory medium, such as RAM or ROM, and machine code stored on other devices (such as floppy disks, flash memory, or a CD ROM, for example). In several exemplary embodiments, software may include source or object code. In several exemplary embodiments, software encompasses any set of instructions capable of being executed on a node such as, for example, on a client machine or server.

In several exemplary embodiments, combinations of software and hardware could also be used for providing enhanced functionality and performance for certain embodiments of the present disclosure. In an exemplary embodiment, software functions may be directly manufactured into a silicon chip. Accordingly, it should be understood that combinations of hardware and software are also included within the definition of a computer system and are thus envisioned by the present disclosure as possible equivalent structures and equivalent methods.

In several exemplary embodiments, computer readable mediums include, for example, passive data storage, such as a random access memory (RAM) as well as semi-permanent data storage such as a compact disk read only memory (CD-ROM). One or more exemplary embodiments of the present disclosure may be embodied in the RAM of a computer to transform a standard computer into a new specific computing machine. In several exemplary embodiments, data structures are defined organizations of data that may enable an embodiment of the present disclosure. In an exemplary embodiment, a data structure may provide an organization of data, or an organization of executable code.

In several exemplary embodiments, any networks and/or one or more portions thereof may be designed to work on any specific architecture. In an exemplary embodiment, one or more portions of any networks may be executed on a single computer, local area networks, client-server networks, wide area networks, internets, hand-held and other portable and wireless devices and networks.

In several exemplary embodiments, a database may be any standard or proprietary database software, such as Oracle, Microsoft Access, SyBase, or DBase II, for example. In several exemplary embodiments, the database may have fields, records, data, and other database elements that may be associated through database specific software. In several exemplary embodiments, data may be mapped. In several exemplary embodiments, mapping is the process of associating one data entry with another data entry. In an exemplary embodiment, the data contained in the location of a character file can be mapped to a field in a second table. In several exemplary embodiments, the physical location of the database is not limiting, and the database may be distributed. In an exemplary embodiment, the database may exist remotely from the server, and run on a separate platform. In an exemplary embodiment, the database may be accessible across the Internet. In several exemplary embodiments, more than one database may be implemented.

In several exemplary embodiments, a plurality of instructions stored on a computer readable medium may be executed by one or more processors to cause the one or more processors to carry out or implement in whole or in part the above-described operation of each of the above-described exemplary embodiments of the apparatus 200 or 300, the method 400, and/or any combination thereof. In several exemplary embodiments, such a processor may include one or more of the microprocessor 500a, any processor(s) that are part of the components of the apparatus 200 or 300, and/or any combination thereof, and such a computer readable medium may be distributed among one or more components of the apparatus 200 or 300. In several exemplary embodiments, such a processor may execute the plurality of instructions in connection with a virtual computer system. In several exemplary embodiments, such a plurality of instructions may communicate directly with the one or more processors, and/or may interact with one or more operating systems, middleware, firmware, other applications, and/or any combination thereof, to cause the one or more processors to execute the instructions.

In view of all of the above and the figures, one of ordinary skill in the art will readily recognize that the present disclosure introduces at least one camera configured to provide three-dimensional imaging of a control volume of three-dimensional space; and at least one device disposed in, or expected to be moved into, the control volume so that the at least one device is included in the three-dimensional imaging when the at least one device is disposed in the control volume and the at least one camera provides the three-dimensional imaging. In one aspect, the control volume includes a wellsite or a portion thereof. In another aspect, the apparatus further includes a second device disposed in the control volume of the three-dimensional imaging wherein the at least one device is movable in relation to the second device and the at least one camera provides relative spatial relationship information for the devices to a controller.

The present disclosure also introduces receiving three-dimensional imaging data associated with a control volume of three-dimensional space; comparing the three-dimensional data with another set of data associated with a device disposed in, or expected to be moved into, the control volume; and controlling the device based on at least the comparison between the three-dimensional data and the another set of data. In one aspect, the control volume includes a wellsite or a portion thereof.

The present disclosure also introduces an apparatus according to one or more aspects of the present disclosure.

The present disclosure also introduces a method having at least one step according to one or more aspects of the present disclosure.

The present disclosure also introduces a system having at least one component having at least one character according to one or more aspects of the present disclosure.

The present disclosure also introduces a kit including at least one component having at least one character according to one or more aspects of the present disclosure.

The foregoing outlines features of several embodiments so that a person of ordinary skill in the art may better understand the aspects of the present disclosure. Such features may be replaced by any one of numerous equivalent alternatives, only some of which are disclosed herein. One of ordinary skill in the art should appreciate that they may readily use the present disclosure as a basis for designing or modifying other processes and structures for carrying out the same purposes and/or achieving the same advantages of the embodiments introduced herein. One of ordinary skill in the art should also realize that such equivalent constructions do not depart from the spirit and scope of the present disclosure, and that they may make various changes, substitutions and alterations herein without departing from the spirit and scope of the present disclosure.

The Abstract at the end of this disclosure is provided to comply with 37 C.F.R. §1.72(b) to allow the reader to quickly ascertain the nature of the technical disclosure. It is submitted with the understanding that it will not be used to interpret or limit the scope or meaning of the claims.

Moreover, it is the express intention of the applicant not to invoke 35 U.S.C. §112, paragraph 6, for any limitations of any of the claims herein, except for those in which the claim expressly uses the word "means" together with an associated function.

The invention claimed is:

1. An apparatus, comprising:
   at least one camera disposed about a well site and configured to provide three-dimensional imaging of a control volume of three-dimensional space, the control volume disposed above ground;
   at least an above ground portion of a drilling rig at the wellsite disposed in the control volume;
   at least one automated mechanical device configured to perform a wellsite operation, the at least one device being disposed in, or expected to be moved into, the control volume so that the at least one device is included in the three-dimensional imaging when performing the wellsite operation in the control volume and the at least one camera provides the three-dimensional imaging;

a second device disposed in the control volume, wherein the at least one device is movable in relation to the second device and the at least one camera provides relative spatial relationship information for the devices to the controller; and wherein the controller controls the second device based on the relative spatial relationship information, such that the second device does not contact the at least one device; and a controller configured to process the three-dimensional imaging, identify a current condition of the at least one device, and provide automated control of the at least one device to move the at least one device from a current condition to a desired condition to perform the wellsite operation.

2. The apparatus of claim 1, wherein the at least one camera is connected to the drilling rig.

3. The apparatus of claim 2, wherein the at least one device comprises one or more of the following: a mast; a crown block; a traveling block; a drilling line; thaw-works; a hook; a top drive; a quill; a tubular lifting device; a drill string; and a pump.

4. The apparatus of claim 1, wherein the controller is further configured to stop the wellsite operation based on the relative spatial relationship information in the event of an unsafe condition.

5. The apparatus of claim 4, wherein the at least one device comprises a tubular; wherein the second device comprises at least one of a top drive, a pipe racker, and a tubular lifting device; and wherein the controller controls the at least one of the top drive, the pipe racker, and the tubular lifting device based on the relative spatial relationship information for the tubular and the at least one of the top drive, the pipe racker, and the tubular lifting device.

6. The apparatus of claim 1, further comprising at least one other camera configured to provide three-dimensional imaging of another control volume of three-dimensional space; wherein another portion of the wellsite is disposed in the another control volume.

7. A method, comprising:

receiving three-dimensional imaging data associated with a control volume of three-dimensional space, wherein at least an above ground portion of a drilling rig at a wellsite is disposed in the control volume;

comparing the three-dimensional imaging data with another set of data comprising positional data associated with an automated mechanical device configured to perform a wellsite operation, the device being disposed in, or expected to be moved into, the control volume;

identifying a current condition of the device based on the comparison of the three-dimensional imaging data and the another set of data;

providing automated control of the device to manipulate the device from the current condition to a desired condition to perform the wellsite operation based on at least the comparison between the three-dimensional imaging data and the another set of data; and providing automated control of the device to stop the device in the event of an unsafe condition in the control volume.

8. The method of claim 7, wherein the device is a tubular; and wherein providing automated control of the device based on at least the comparison between the three-dimensional imaging data and the another set of data comprises controlling at least one of a top drive, a pipe racker, a tubular lifting device, and draw-works.

9. The method of claim 7, further comprising providing automated control of the device to stop the device if a human or an unknown object enters the control volume.

10. A method, comprising:

receiving three-dimensional imaging data associated with a control volume of three-dimensional space, wherein at least an above ground portion of a drilling rig at a wellsite is disposed in the control volume;

determining a location of a first system using the three-dimensional imaging data, wherein the first system comprises one or more of the following: a tubular on a pipe racker, a hoisting system of a drilling rig, a top drive system, a casing running tool, and an iron roughneck;

determining a location of a second system using the three-dimensional data; and providing automated control of the second system located at the wellsite to manipulate the second system from a current condition to a desired condition to perform a wellsite operation taking into account the calculated one or more dimensions representative of the determined location of the first system and controlling the second system to avoid contacting the first system in an uncontrolled manner.

11. The method of claim 10, wherein the second system located at the wellsite and controlled using the one or more dimensions comprises one Or more of the following: an iron roughneck, a pipe handler, a casing running tool, a top drive system, a hoisting system, and a mud tank farm.

12. The method of claim 11, wherein the second system comprises the mud tank farm, the mud tank farm comprising one or more active mud tanks; and wherein the one or more dimensions comprise respective fluid levels in the one or more active mud tanks.

13. The method of claim 10, further comprises at least one of the following:

calibrating the first system located at the wellsite using the calculated one or more dimensions; identifying a first component located at the wellsite based on the calculated one or more dimensions; and counting a plurality of second components located at the site based on the calculated one or more dimensions.

14. The method of claim 13, comprising calibrating the first system located at the wellsite using the calculated one or more dimensions.

15. The method of claim 13, comprising identifying the first component located at the wellsite based on the calculated one or more dimensions; wherein the calculated one or more dimensions comprise the length of the tubular; and wherein the first component is identified by comparing the length of the tubular with a criteria.

16. The method of claim 13, comprising counting a plurality of second components associated with the second system located at the wellsite; wherein the plurality of second components located at the wellsite is a plurality of tubulars on a pipe rack, each of the tubulars having a length; wherein the calculated one or more dimensions comprise respective lengths of the tubulars; and wherein counting the plurality of second components comprises: identifying each of the tubulars by comparing the length of the tubular with a criteria; and counting a quantity of tubulars that meet the criteria.

17. An apparatus, comprising:
a non-transitory computer readable medium; and a plurality of instructions stored on the computer readable medium and executable by one or more processors, the plurality of instructions comprising:

instructions that cause the one or more processors to receive three-dimensional imaging data associated with a control volume of three-dimensional space, wherein at least an above ground portion of a drilling rig at a wellsite is disposed in the control volume, the portion of the drilling rig comprising a pipe racker;

instructions that cause the one or more processors to compare the three-dimensional imaging data with another set of data comprising positional data associated with an automated mechanical device configured to connect or disconnect one or more tubulars with the pipe racker, the one or more tubulars being disposed in, or expected to be moved into, the control volume;

instructions that identify a current condition of the device based on the comparison of the three-dimensional imaging data and the another set of data; and instructions that cause the one or more processors to provide automated control of the device to manipulate the one or more tubulars based on at least the comparison between the three-dimensional imaging data and the another set of data.

18. An apparatus, comprising:

a non-transitory computer readable medium; and a plurality of instructions stored on the computer readable medium and executable by One or more processors, the plurality of instructions comprising:

instructions that cause the one or more processors to receive three-dimensional imaging data associated with a control volume of three-dimensional space, wherein at least an above ground portion of a drilling rig at a wellsite is disposed in the control volume;

instructions that cause the one or more processors to calculate one or more dimensions using the three-dimensional imaging data;

instructions that identify a current condition of a first system located at the wellsite based on the three-dimensional imaging data, the first system comprising one or more of the following: a hoisting system of a drilling rig, a top drive system, a casing running tool, a pipe racker, and an iron roughneck; and instructions that cause the one or more processors to provide automated control of a second system located at the wellsite to manipulate the second system from a current condition to a desired condition to perform a wellsite operation using the calculated one or more dimensions.

19. The apparatus of claim 18, wherein the second system located at the wellsite and controlled using the calculated one or more dimensions comprises one or more of the following: an iron roughneck, a pipe handler, a casing running tool, a top drive system, a hoisting system, and a mud tank farm.

20. The apparatus of claim 19, wherein the second system comprises the mud tank farm, the mud tank farm comprising one or more active mud tanks; and wherein the one or more dimensions comprise respective fluid levels in the one or more active mud tanks.

21. The apparatus of claim 18, wherein the plurality of instructions further comprises at least one of the following:

instructions that cause the one or more processors to calibrate the first system located at the wellsite using the calculated one or more dimensions;

instructions that cause the one or more processors to identify a first component located at the wellsite based on the calculated one or more dimensions; and instructions that cause the one or more processors to count a plurality of second components located at the wellsite based on the calculated one or more dimensions.

22. The apparatus of claim 21, wherein the plurality of instructions comprises the instructions that cause the one or more processors to identify a first component located at the wellsite based on the calculated one or more dimensions; wherein the first second component located at the wellsite is a tabular on a pipe rack, the tubular having a length; wherein the calculated one or more dimensions comprise the length of the tubular; and wherein the first component is identified by comparing the length of the tubular with a criteria.

23. The apparatus of claim 21, wherein the plurality of instructions comprises the instructions that cause the one or more processors to count a plurality of second components located at the wellsite; wherein the plurality of second components located at the wellsite is a plurality of tubulars on a pipe rack, each of the tubulars having a length; wherein the calculated one or more dimensions comprise respective lengths of the tubulars; and wherein the instructions that cause the one or more processors to count the plurality of second components comprise: instructions that cause the one or more processors to identify each of the tubulars by comparing the length of the tubular with a criteria; and instructions that cause the one or more processors to count a quantity of tubulars that meet the criteria.

* * * * *